(12) United States Patent
Ito et al.

(10) Patent No.: US 10,664,109 B2
(45) Date of Patent: May 26, 2020

(54) DISPLAY DEVICE

(71) Applicant: Japan Display Inc., Tokyo (JP)

(72) Inventors: Daisuke Ito, Tokyo (JP); Hayato Kurasawa, Tokyo (JP); Toshihiko Fujiwara, Tokyo (JP)

(73) Assignee: Japan Display Inc., Tokyo (JP)

( * ) Notice: Subject to any disclaimer, the term of this patent is extended or adjusted under 35 U.S.C. 154(b) by 113 days.

(21) Appl. No.: 15/867,202

(22) Filed: Jan. 10, 2018

(65) Prior Publication Data

US 2018/0196549 A1    Jul. 12, 2018

(30) Foreign Application Priority Data

Jan. 12, 2017  (JP) ................................. 2017-003534

(51) Int. Cl.
| | | |
|---|---|---|
| *G06F 3/044* | (2006.01) | |
| *G06F 3/041* | (2006.01) | |
| *G02F 1/1343* | (2006.01) | |
| *G02F 1/1335* | (2006.01) | |

(Continued)

(52) U.S. Cl.
CPC .......... *G06F 3/044* (2013.01); *G02F 1/13338* (2013.01); *G02F 1/133512* (2013.01); *G02F 1/133528* (2013.01); *G02F 1/134309* (2013.01); *G06F 3/0412* (2013.01); *G06F 3/0416* (2013.01); *H03K 17/9622* (2013.01); *G02F 2202/28* (2013.01); *G06F 2203/04107* (2013.01); *G06F 2203/04111* (2013.01); *H03K 2017/9602* (2013.01); *H03K 2217/96023* (2013.01); *H03K 2217/960755* (2013.01)

(58) Field of Classification Search
CPC ...... G06F 3/044; G06F 3/0412; G06F 3/0416; G06F 2203/04107; G06F 2203/04111; G02F 1/13338; G02F 1/133512; G02F 1/133528; G02F 1/134309; G02F 2202/28; H03K 17/9622; H03K 2017/9602; H03K 2217/96023; H03K 2217/960755

See application file for complete search history.

(56) References Cited

U.S. PATENT DOCUMENTS

| | | | |
|---|---|---|---|
| 8,692,950 B2* | 4/2014 | Lee ................... | G02F 1/133308 345/173 |
| 10,191,202 B2* | 1/2019 | Huang .................... | G06F 3/044 |

(Continued)

FOREIGN PATENT DOCUMENTS

JP          2014-174760 A      9/2014

*Primary Examiner* — Amare Mengistu
*Assistant Examiner* — Crystal Mathews
(74) *Attorney, Agent, or Firm* — Michael Best & Friedrich LLP

(57) ABSTRACT

According to one embodiment, a display device includes a display panel having a display area, a first substrate opposed to the display panel, an adhesive layer arranged between the display panel and the first substrate, a first electrode formed at the first substrate in a peripheral area arranged along at least a part of an outer edge of the display area, a second electrode formed at the display panel in the peripheral area. In the display device, the first electrode includes a first portion which is opposed to the second electrode and a second portion which is not opposed to the second electrode, and the adhesive layer is interposed between the first portion and the second electrode.

15 Claims, 13 Drawing Sheets

(51) Int. Cl.
   *G02F 1/1333*  (2006.01)
   *H03K 17/96*  (2006.01)

(56) References Cited

U.S. PATENT DOCUMENTS

| | | | | |
|---|---|---|---|---|
| 2003/0058225 A1* | 3/2003 | Kusuda | ............... | G06F 3/045 345/173 |
| 2003/0222660 A1* | 12/2003 | Morimoto | ............... | G01L 1/142 324/661 |
| 2007/0008299 A1* | 1/2007 | Hristov | ............... | G06F 3/0416 345/173 |
| 2009/0184920 A1* | 7/2009 | Francis | ............... | G06F 3/03547 345/156 |
| 2010/0182273 A1* | 7/2010 | Noguchi | ............... | G02F 1/13338 345/174 |
| 2011/0122090 A1* | 5/2011 | Suetomi | ............... | G06F 3/045 345/174 |
| 2011/0279405 A1* | 11/2011 | Meng | ............... | G06F 3/044 345/174 |
| 2012/0182258 A1* | 7/2012 | Kubo | ............... | G06F 3/03547 345/174 |
| 2012/0249446 A1* | 10/2012 | Chen | ............... | G06F 3/044 345/173 |
| 2013/0199915 A1* | 8/2013 | Guard | ............... | G06F 3/044 200/600 |
| 2013/0285971 A1* | 10/2013 | Elias | ............... | G06F 3/044 345/174 |
| 2014/0184951 A1* | 7/2014 | Yeh | ............... | G06F 3/044 349/12 |
| 2014/0253501 A1* | 9/2014 | Noguchi | ............... | G02F 1/13338 345/174 |
| 2014/0340348 A1* | 11/2014 | Park | ............... | G06F 3/044 345/174 |
| 2015/0103263 A1* | 4/2015 | Han | ............... | G06F 1/1643 349/12 |
| 2015/0116259 A1* | 4/2015 | Chen | ............... | G06F 3/0416 345/174 |
| 2015/0277642 A1* | 10/2015 | Jiang | ............... | G06F 1/16 345/173 |
| 2016/0011692 A1* | 1/2016 | Heim | ............... | G06F 3/017 345/174 |
| 2016/0132142 A1* | 5/2016 | Chiu | ............... | G06F 3/044 345/173 |
| 2016/0195955 A1* | 7/2016 | Picciotto | ............... | G06F 3/044 345/174 |
| 2016/0253040 A1* | 9/2016 | Lee | ............... | H03K 17/962 345/174 |
| 2017/0090239 A1* | 3/2017 | Jung | ............... | G02F 1/133308 |
| 2017/0153725 A1* | 6/2017 | Park | ............... | G06F 3/0412 |
| 2017/0160850 A1* | 6/2017 | Cao | ............... | G06F 3/0412 |

* cited by examiner

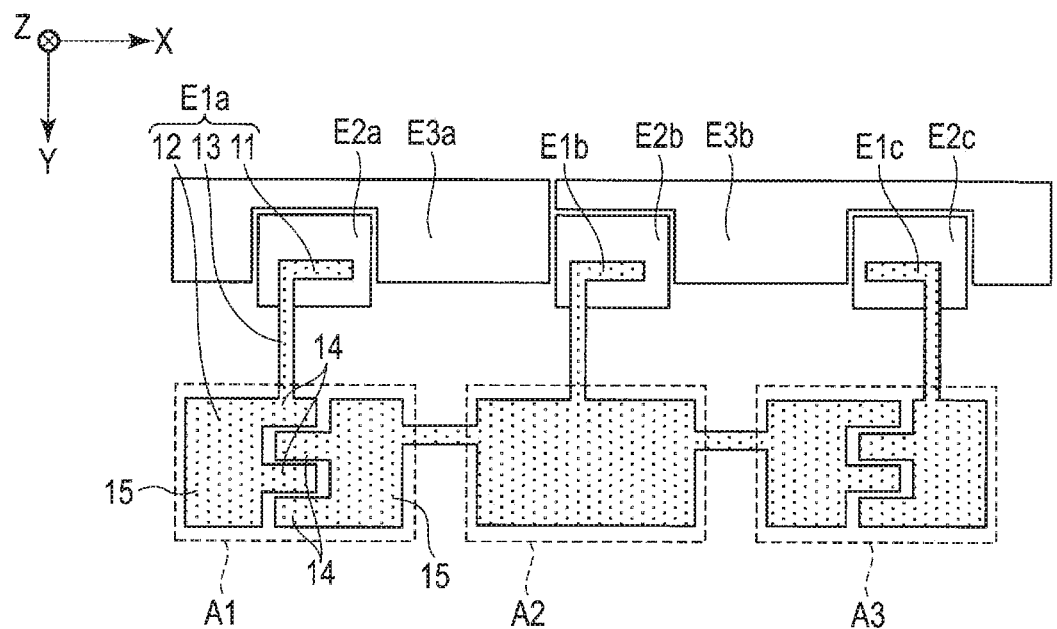
F I G. 13
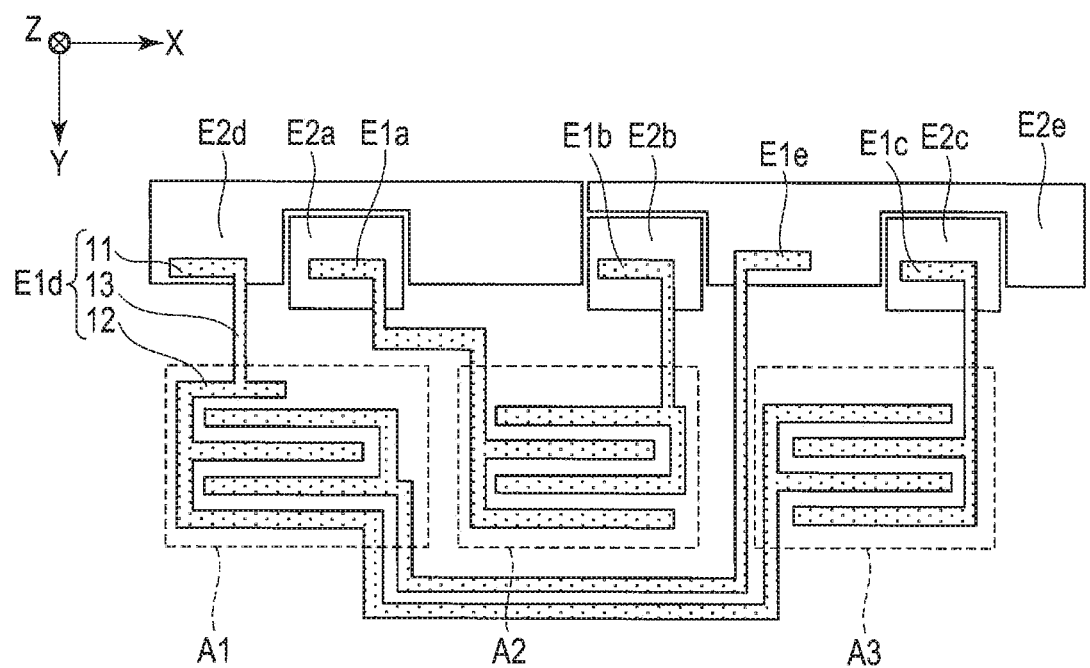
F I G. 14

DISPLAY DEVICE

CROSS-REFERENCE TO RELATED APPLICATIONS

This application is based upon and claims the benefit of priority from Japanese Patent Application No. 2017-003534, filed Jan. 12, 2017, the entire contents of which are incorporated herein by reference.

FIELD

Embodiments described herein relate generally to a detection device and a display device with a detection device.

BACKGROUND

Recently, various display devices having display areas have employed detection devices which detect operations with respect to the display areas. In general, this detection device is referred to as a touch panel, a touch sensor, a touchscreen, etc.

Further, in smartphones and tablet computers, sensors (or buttons) which perform zero-dimensional input (on/off) are provided outside the display areas in some cases.

With regard to the detection of an operation with respect to the display area, various improvements are made and operability is improving year after year. Accordingly, the improvement of operability is also required of the sensor provided outside the display area.

BRIEF DESCRIPTION OF THE DRAWINGS

FIG. 13 is a plan view of electrode shapes in the fourth embodiment.

FIG. 14 is a plan view of electrode shapes in the fifth embodiment.

DETAILED DESCRIPTION

Figure 1:
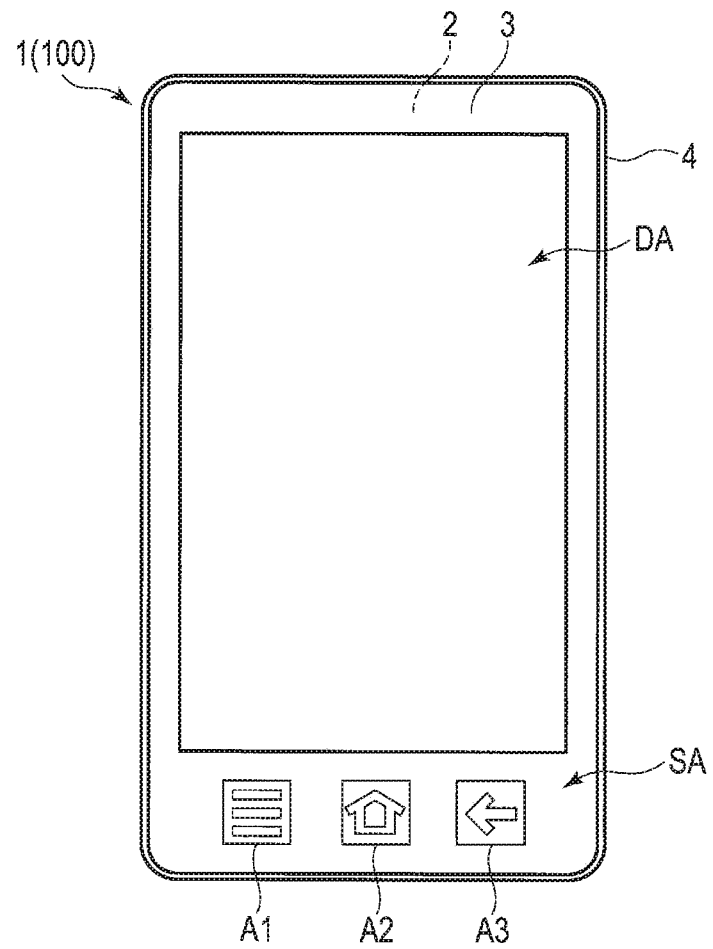
FIG. 1 is a plan view schematically showing the structure of a display device in the first embodiment.

In general, according to one embodiment, a display device includes a display panel having a display area, a first substrate opposed to the display panel, an adhesive layer arranged between the display panel and the first substrate, a first electrode formed at the first substrate in a peripheral area arranged along at least a part of an outer edge of the display area, a second electrode formed at the display panel in the peripheral area. In the display device, the first electrode includes a first portion which is opposed to the second electrode and a second portion which is not opposed to the second electrode, and the adhesive layer is interposed between the first portion and the second electrode.

According to another embodiment, a display device includes a display panel having a display area, a first substrate opposed to the display area, a plurality of first electrodes formed at the first substrate in a peripheral area arranged along at least a part of an outer edge of the display area, a plurality of second electrodes formed at the display panel in the peripheral area, a third electrode formed at the display panel in the peripheral area. In the display device, the first electrodes include a first portion which is opposed to the corresponding second electrode and a second portion which is not opposed to the second electrode, and the third electrode is not opposed to the first electrodes and is adjacent to the second electrodes in a plan view.

According to these display devices, the operability of a display device or a detection device including a sensor outside a display area can be improved.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, illustration is provided schematically in the drawings, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements equivalent or similar to those described in connection with preceding drawings are denoted by the same reference numbers, and detailed description thereof is omitted unless necessary.

In each embodiment, a liquid crystal display device is disclosed as an example of a display device. However, each embodiment does not preclude application of individual technical ideas disclosed in the embodiment to other display devices. For example, the other display devices are assumed to be a self-luminous display device including an organic electroluminescent display element, an electronic-paper type display device including an electrophoresis element, etc.

Further, each embodiment illustrates a case where a display device also acts as a detection device which detects a user operation. However, a structure related to operation detection disclosed in the embodiment is also applicable to a detection device which is provided separately from a display device.

First Embodiment

FIG. 1 is a plan view schematically showing the structure of a display device 1 according to the first embodiment. The display device 1 is a smartphone or a tablet computer, for example. Note that the display device 1 may be another display device such as a mobile phone, a personal computer, a television receiver, an in-car device, a game console or a wearable device.

The display device 1 includes a display panel 2, a cover member 3 (first substrate) which covers the display panel 2, and a housing 4 which accommodates the display panel 2. The cover member 3 is formed of transparent glass, for example, and protects the display panel 2. The cover member 3 may also be formed of a transparent resin material.

Further, the display device 1 includes a display area DA (first area), a peripheral area SA (second area). The display area DA is an area for displaying an image. The display area DA is an area where pixels which will be described later are arranged, for example. The peripheral area SA is an area arranged along at least a part of an outer edge of the display area DA. For example, the peripheral area SA surrounds the display are DA. The peripheral area SA includes at least a sensor area A. The sensor area A is also referred to as an icon sensor or an icon button. As described above, the display device 1 not only has a structure for displaying an image in the display area DA but also has a structure as a detection device 100 which detects operations with respect to the display area DA and the sensor area A.

In the example shown in FIG. 1, the peripheral area SA includes sensor areas A1, A2 and A3. For example, specific operations are respectively assigned to the sensor areas A1 to A3 beforehand. As one example, an operation of displaying a menu screen in the display area DA is assigned to the sensor area A1, an operation of displaying a home screen (or a standby screen) in the display area DA is assigned to the sensor area A2, and an operation of returning the screen of the display area DA to the previously-displayed screen is assigned to the sensor area A3. Pictures corresponding to the respective functions are depicted in the sensor areas A1 to A3. Note that the display device 1 may include one, two, or four or more sensor areas A. Further, the operation assigned to each sensor area A can also be appropriately changed.

Figure 2:
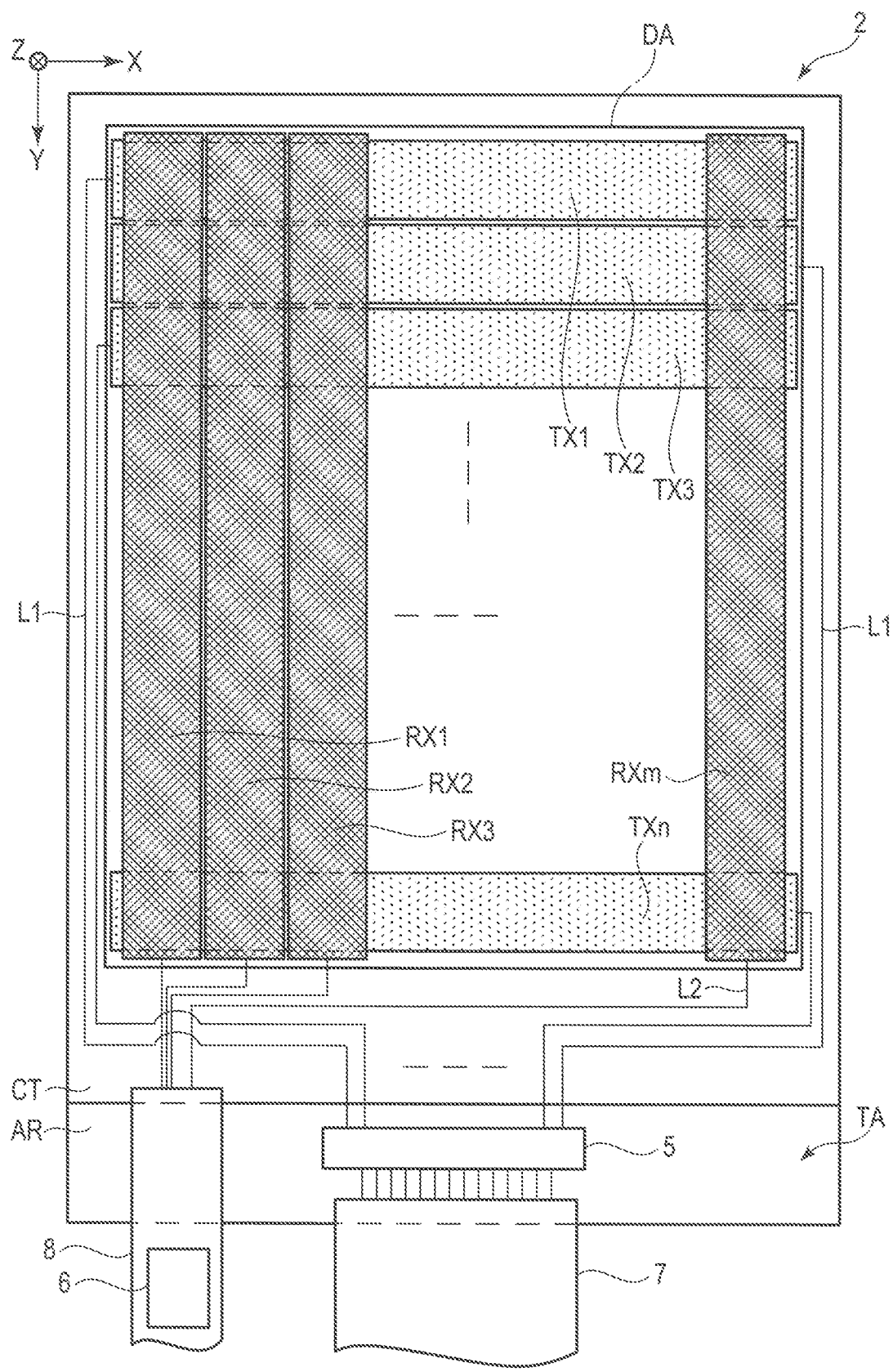
FIG. 2 is a plan view schematically showing a display panel in the first embodiment.

FIG. 2 is a schematic plan view of the display panel 2. The drawing here mainly shows elements related to detection of an operation with respect to the display area DA. The display panel 2 includes a counter-substrate CT (second substrate), an array substrate AR (third substrate), a driver IC 5, a detector IC 6, a first flexible printed circuit board 7 (fourth substrate) and a second flexible printed circuit board 8 (fifth substrate). The counter-substrate CT is opposed to the cover member 3. The array substrate AR and the counter-substrate CT are opposed to each other. A display function layer, for example, a liquid crystal layer LC which will be described later is arranged between the array substrate AR and the counter-substrate CT. At least either one of the fourth substrate and the fifth substrate is not limited to a flexible printed circuit board and may be a rigid-flexible printed circuit board.

The array substrate AR has a terminal area TA which does not overlap the counter-substrate CT in a plan view. The driver IC 5 is provided on the terminal area TA. The first flexible printed circuit board 7 is connected to an edge of the array substrate AR. The driver IC 5 executes processing for displaying an image in the display area DA based on a signal supplied via the first flexible printed circuit board 7. The second flexible printed circuit board 8 is connected to an edge of the counter-substrate CT. In the example shown in FIG. 2, the detector IC 6 is provided on the second flexible printed circuit board 8.

Further, the display panel 2 includes a plurality of drive electrodes TX (TX1 to TXn) and a plurality of detection electrodes RX (RX1 to RXm). The drive electrode Tx extends in a first direction X in the display area DA. The detection electrode Rx extends in a second direction Y in the display area DA. The first direction X and the second direction Y cross each other, and for example, orthogonally cross each other. Further, the drive electrode TX is arranged in the second direction Y in the display area DA. The detection electrode RX is arranged in the first direction X. At least one of the drive electrode TX and the detection electrode RX may be arranged in a direction other than the first direction X and the second direction Y. A direction which orthogonally crosses the first direction X and the second direction Y (the thickness direction of the display panel 2) is hereinafter referred to as a third direction Z. For example, the plan view is referred to a view from the direction Z.

In the present embodiment, the drive electrode TX is formed in the array substrate AR, and the detection electrode RX is formed in the counter-substrate CT. However, the forming locations of the drive electrode TX and the detection electrode RX are not limited to this example. The drive electrode TX and the detection electrode RX can be formed of a transparent conductive material such as indium tin oxide (ITO), for example. The detection electrode RX may be formed of a metal wire.

The drive electrode TX is connected to the driver IC 5 via a lead line L1 formed outside the display area DA. The detection electrode RX is connected to the detector IC 6 via a lead line L2 formed outside the display area DA and formed on the second flexible printed circuit board 8. In the example shown in FIG. 2, the lead lines L1 are formed between the display area DA and the right and left sides of the display panel 2, respectively. The lead lines L1 are not necessarily formed in this manner but may be formed between the display DA and one of the right and left sides of the display panel 2.

The drive electrode TX and the detection electrode RX are opposed to each other via dielectrics such as various insulating layers. Therefore, capacitance is formed between the drive electrode TX and the detection electrode RX. The detector IC 6 detects an operation with respect to the display area DA based on a change in this capacitance.

Figure 3:
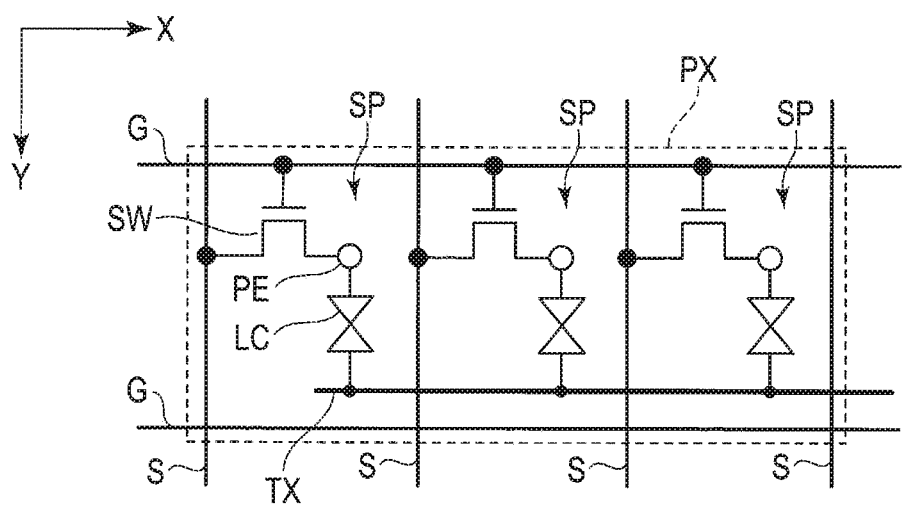
FIG. 3 is a diagram schematically showing the equivalent circuit of a pixel in the first embodiment.

A number of pixels are arrayed in the display area DA. FIG. 3 is a diagram schematically showing the equivalent circuit of a pixel PX. The pixel PX includes a plurality of sub-pixels SP which display different colors. Although one pixel PX includes three sub-pixels SP in the example illustrated, one pixel PX may include one, two, or four or more sub-pixels SP. For example, the colors of the sub-pixels SP are red, green, blue, white, etc.

The sub-pixel SP includes a switching element SW, and a pixel electrode PE connected to the switching element SW. The switching element SW is further connected to one of a plurality of scanning lines G and one of a plurality of signal lines S. The scanning line G extends in the first direction X and is arranged in the second direction Y. The signal line S extends in the second direction Y and is arranged in the first direction X.

If a scanning signal is supplied to the scanning line G connected to one switching element SW, the signal line S and the pixel electrode PE connected to this switching element SW are electrically connected to each other, and an image signal supplied to the signal line S is supplied to the pixel electrode PE. An electric field which acts on the liquid crystal layer LC is formed between the pixel electrode PE which is supplied with the image signal, and the drive electrode TX.

In the present embodiment, the drive electrode TX not only acts as an electrode for detecting an operation with respect to the display area DA but also acts as an electrode for displaying an image in the display area DA, which is known as a common electrode. In other words, the drive electrode TX is supplied with a display drive signal for displaying the image and with a touch drive signal (first drive signal) for detecting the object in the display area DA. However, a common electrode designed for display may be provided separately from the drive electrode TX.

Subsequently, a structure related to the sensor area A will be described with reference to FIG. 4. The drawing shows a state where the display panel 2 and the cover member 3 are separated from each other. The counter-substrate CT has a first light-shielding layer 20 in the peripheral area SA. Further, the cover member 3 has a second light-shielding layer 30 in the peripheral area SA. The light-shielding layers 20 and 30 have an opening formed in a shape corresponding to the display area DA. These openings have the same size, for example, but the opening of the cover member 3 may be slightly large in consideration of an error in attaching the display panel 2 and the cover member 3 to each other.

The cover member 3 includes a first electrode E1 in the peripheral area SA. Further, the display panel 2 includes a second electrode E2 and a third electrode E3 adjacent to the second electrode E2 in the peripheral area SA. The first electrode E1 is located between a side (lower side in the drawing) of the cover member 3 which is opposed to the terminal area TA of the array substrate AR, and the display area DA, and is formed on a surface of the cover member 3 which is opposed to the display panel 2, for example. Each of the sensor areas A1 to A3 is also formed in the same location. The second electrode E2 and the third electrode E3 are located between the terminal area TA and the display area DA, and are formed on the counter-substrate CT, for example.

The first electrode E1 has a first portion 11 which is opposed to the second electrode E2, a second portion 12 which is not opposed to the second electrode E2, and a third portion 13 which connects the first portion 11 and the second portion 12. The first electrode E1 and the third electrode E3 are not opposed to each other. The portions 11 to 13 overlap the second light-shielding layer 30 in a plan view. The second portion 12 is formed in the corresponding sensor area A. As will be described later with reference to FIG. 7, etc., the second portion 12 of one first electrode E1 may be formed over several sensor areas A.

Figure 4:
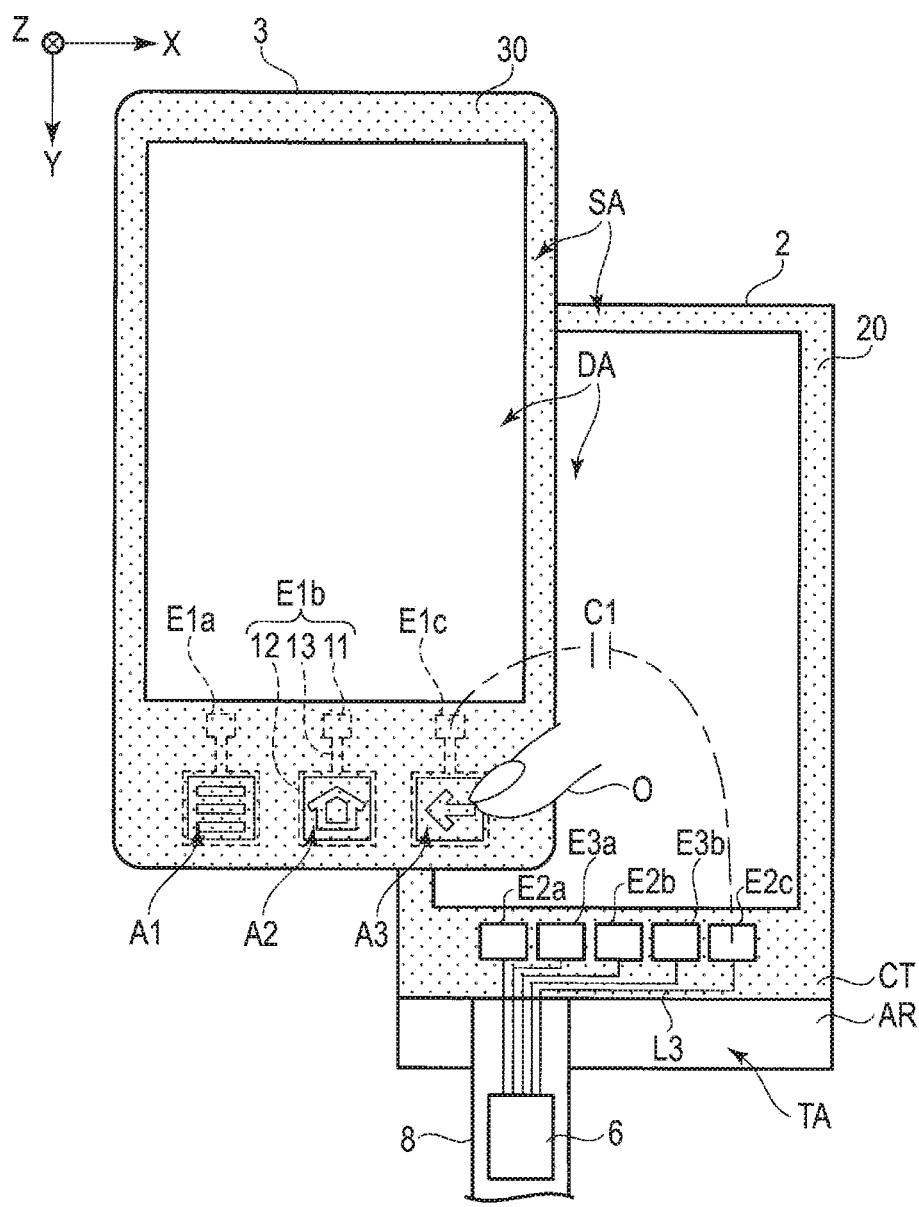
FIG. 4 is a diagram showing a structure related to a sensor area in the first embodiment.

In the example shown in FIG. 4, three first electrodes E1a, E1b and E1c, three second electrodes E2a, E2b and E2c, and two third electrodes E3a and E3b are illustrated. Note that the number of each of the electrodes E1 to E3 is not limited to this example but may be an arbitrary number. Further, as in the fifth embodiment which will be described later, a structure without the third electrode E3 can also be applied.

For example, the first portion 11 of the first electrode E1a is opposed to the second electrode E2a, the first portion 11 of the first electrode E1b is opposed to the second electrode E2b, and the first portion 11 of the first electrode E1c is opposed to the second electrode E2c. Further, the second portion 12 of the first electrode E1a is formed at least in the sensor area A1, the second portion 12 of the first electrode E1b is formed at least in the sensor area A2, and the second portion 12 of the first electrode E1c is formed at least in the sensor area A3.

The second electrodes E2a to E2c and the third electrodes E3a and E3b are arranged in the first direction X, and are connected to the detector IC 6 via lead lines L3 and the second flexible printed circuit board 8. In the example shown in FIG. 4, the third electrode E3a is arranged between the second electrodes E2a and E2b, and the third electrode E3b is arranged between the second electrodes E2b and E2c. The first portions 11 of the first electrodes E1a to E1c and the sensor areas A1 to A3 are also arranged in the first direction X.

In the above-described structure, capacitance C1 is formed between the first electrode E1 and the second electrode E2 which are opposed to each other. When an object O such as a user's finger contacts the sensor area A, capacitance C2 (shown in FIG. 5) is formed between and the object O and the first electrode E1, and the capacitance C1 changes under the influence of the capacitance C2. The detector IC 6 detects an operation in the sensor areas A1 to A3 based on a change in the capacitance C1.

Figure 5:
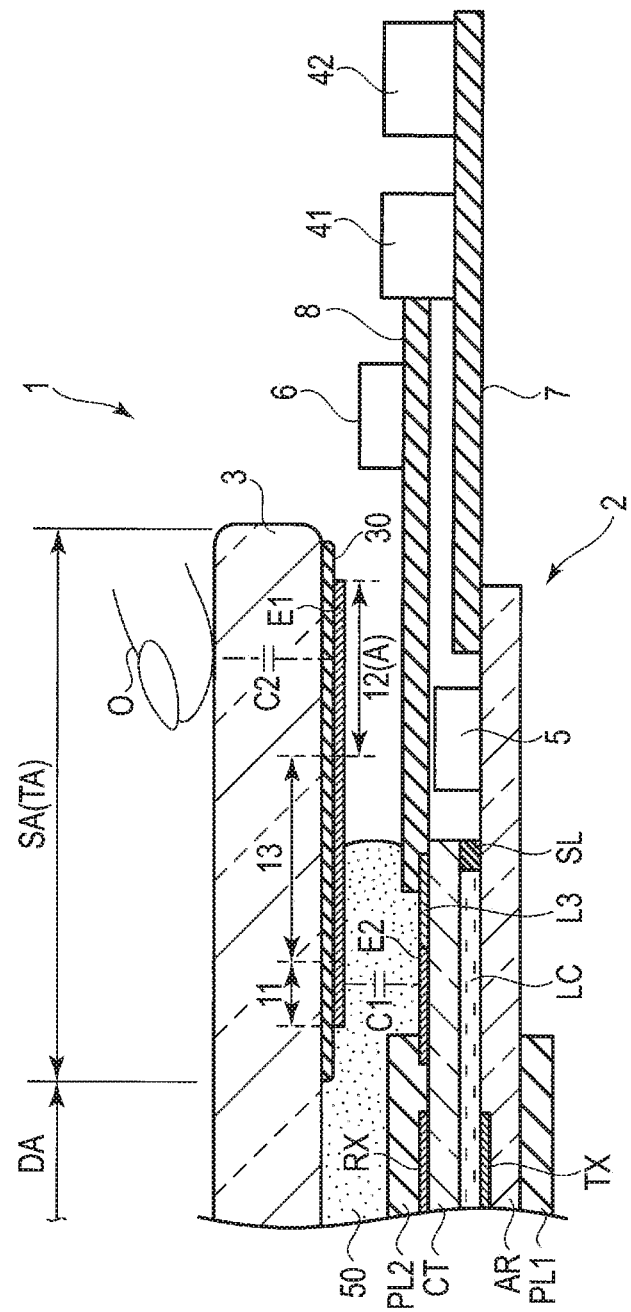
FIG. 5 is a sectional diagram schematically showing the display device in the first embodiment.

FIG. 5 is a sectional diagram schematically showing the structure of the display device 1 in the vicinity of the terminal area TA. The first electrode E1, the second electrode E2 and the sensor area A shown in the drawing indicate any one of the first electrodes E1a to E1c, the second electrodes E2a to E2c and the sensor areas A1 to A3, respectively.

The array substrate AR and the counter-substrate CT are attached to each other via a sealant SL. The liquid crystal layer LC is sealed between the array substrate AR and the counter-substrate CT by the sealant SL. In the example shown in FIG. 5, the drive electrode TX is provided in the array substrate AR. The detection electrode RX, the second electrode E2 and the lead line L3 are formed on the outer surface (surface opposed to the cover member 3) of the counter-substrate CT. For example, the detection electrode RX, the second electrode E2 and the lead line L3 can be formed of the same material in the same process.

The second light-shielding layer 30 is formed on the inner surface (surface opposed to the display panel 2) of the cover member 3. The first electrode E1 is formed on the second light-shielding layer 30. For example, a metal material such as silver can be used as the material for the first electrode E1. The first electrode E1 may be formed between the second light-shielding layer 30 and the cover member 3. The picture of the sensor area A can be formed by partially removing the light-shielding layer 30, for example. The picture may be formed of a colored material between the light-shielding layer 30 and the cover member 3.

The display device 1 further includes a first polarizing layer PL1, a second polarizing layer PL2, a first connector 41, a second connector 42 and an insulating adhesive layer 50. The first polarizing layer PL1 is attached to an outer surface of the array substrate AR. The outer surface of the array substrate AR is opposed to the inner surface of the array substrate AR in which the drive electrodes TX is arranged. The second polarizing layer PL2 is attached to the outer surface of the counter-substrate CT over the detection electrode RX. In the example shown in FIG. 5, part of the second electrode E2 is covered with the second polarizing layer PL2. However, the whole second electrode E2 may be exposed from the second polarizing layer PL2 or the whole second electrode E2 may be covered with the second polarizing layer PL2.

The first connector 41 connects the flexible printed circuit boards 7 and 8. The second connector 42 is provided on the first flexible printed circuit board 7, and connects the display panel 2 and an electronic device to be equipped with the display panel 2.

The adhesive layer 50 is formed among the display panel 2 and the cover member 3, and attaches the display panel 2 and the cover member 3 to each other. In the example shown in FIG. 5, an edge of the adhesive layer 50 is located on the second flexible printed circuit board 8. That is, the adhesive layer 50 covers the second polarizing layer PL2, the second electrode E2 and the lead line L3 and also covers the connecting portion of the lead line L3 and the second flexible printed circuit board 8. Accordingly, moisture can be prevented from permeating into the connecting portion from the outside.

In the above-described structure, space between the first portion 11 of the first electrode E1 and the second electrode E2 is filled with the adhesive layer 50. If the adhesive layer 50 is not interposed in the space between the first portion 11 and the second electrode E2, the space is an air layer. The dielectric constant of the adhesive layer 50 is higher than the dielectric constant of the air layer. The capacitance C1 when the adhesive layer 50 is arranged in the space is bigger than the capacitance C1 when the air layer is arranged in the space. Therefore, the amount of change in the capacitance C1 in accordance with the capacitance C2 formed between the object O and the first electrode E1 increases, and the detection sensitivity to an operation with respect to the sensor area A improves.

Figure 6:
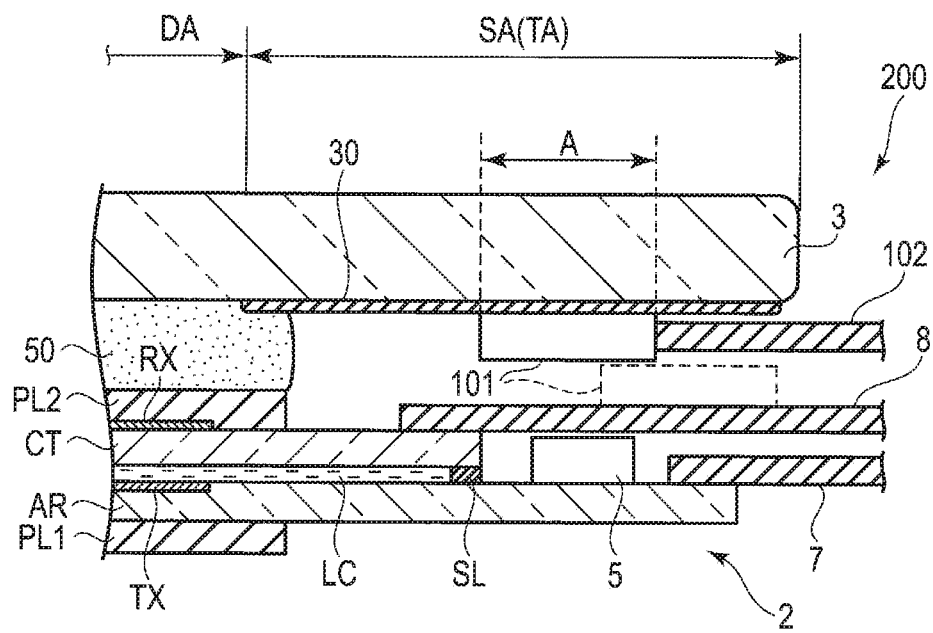
FIG. 6 is a sectional diagram showing the structure of a display device according to a comparative example.

Here, the structure of a display device 200 according to a comparative example of the present embodiment is shown in FIG. 6. In the display device 200, an operation with respect to the sensor area A is detected by a sensor unit 101 without using the first electrode E1 and the second electrode E2.

The sensor unit 101 is provided on the second light-shielding layer 30 as shown by a solid line, for example. In this structure, arrangement space needs to be secured for the sensor unit 101 between the cover member 3 and the display panel 2 by increasing the thicknesses of the second polarizing layer PL2 and the adhesive layer 50, for example. Therefore, the thickness of the display device 200 increases. Further, the sensor unit 101 needs to be connected to the second flexible printed circuit board 8 via a flexible printed circuit board 102 shown in the drawing or a connector, for example, and therefore the number of components increases.

The sensor unit 101 can also be provided on the second flexible printed circuit board 8 as shown by a dashed line. In this case also, arrangement space needs to be secured for the sensor unit 101. Further, because of the limitation of the mounting location of the sensor unit 101 on the second flexible printed circuit board 8, the display area DA and the sensor area A are separated from each other, and the peripheral area SA needs to be increased in some cases.

In contrast to this comparative example, the sensor unit 101 and the flexible printed circuit board 102 are not required in the display device 1 of the present embodiment. Therefore, the thickness of the display device 1 can be reduced, and the location of the sensor area A will not be limited.

Figure 7:
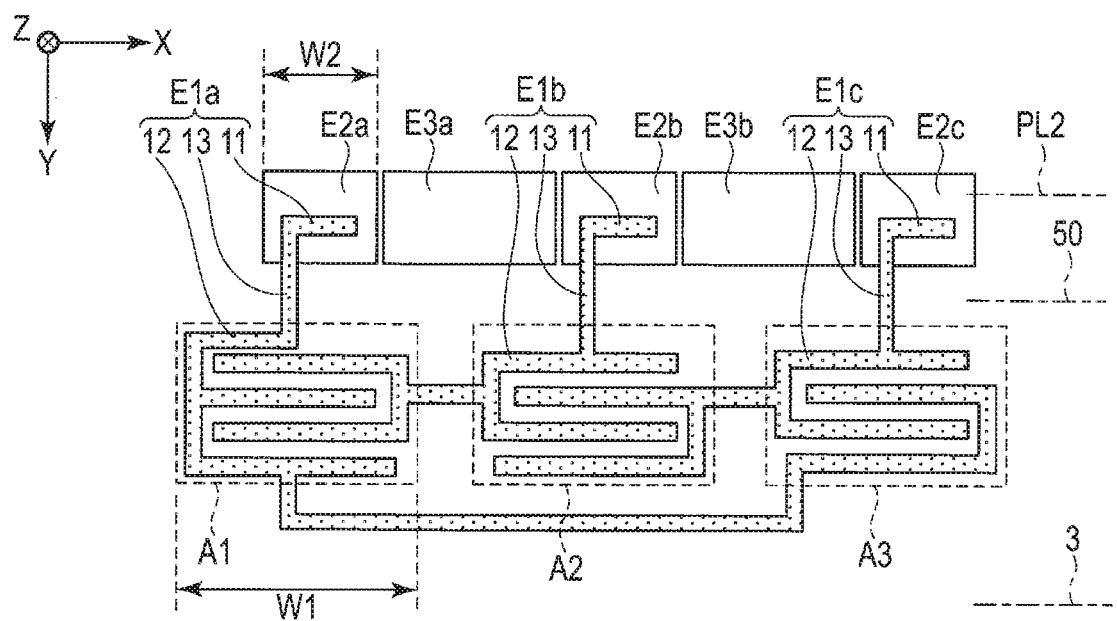
FIG. 7 is a plan view of electrode shapes in the first embodiment.

Next, the electrodes E1 to E3 will be described in detail. FIG. 7 is a plan view showing an example of the shapes applicable to the electrodes E1 to E3. In this example, the third electrode E3a is arranged between the second electrodes E2a and E2b, and the third electrode E3b is arranged between the second electrodes E2b and E2c. Further, the electrodes E2a to E2c, E3a and E3b are arranged in the first direction X.

The first portions 11 of the first electrodes E1a to E1c are opposed to the second electrodes E2a to E2c, respectively. These first portions 11 are connected to the second portions 12 via the third portions 13, respectively. The second portion 12 of the first electrode E1a is arranged in the sensor area A1 and is also arranged in the sensor area A3. The second portion 12 of the first electrode E1b is arranged in the sensor area A2 and is also arranged in the sensor area A1. The second portion 12 of the first electrode E1c is arranged in the sensor area A3 and is also arranged in the sensor area A2.

In the example shown in FIG. 7, the widths of the first portions 11, the second portions 12 and the third portions 13 of the first electrodes E1a to E1c are all the same. However, these widths may be different from each other. Further, a first width W1 of the sensor areas A1 to A3 in the first direction X is greater than a second width W2 of the second electrodes E2a to E2c in the first direction X. Under this condition, arrangement space for the electrodes E2a to E2c, E3a and E3b can be reduced as compared to the sensor areas A1 to A3.

In this way, the second portions 12 of two of the first electrodes E1a to E1c are arranged separately from each other in each of the sensor areas A1 to A3. In light of improvement of detection sensitivity, two second portions 12 should preferably be dispersed over the sensor areas A1 to A3.

FIG. 7 shows an example of the locations of an edge of the second polarizing layer PL2, an edge of the adhesive layer 50 and an edge of the cover member 3 on the right side of the drawing by dashed-dotted lines. The edge of the adhesive layer 50 is located between the edge of the second polarizing layer PL2 and the edge of the cover member 3 in a plan view. Further, the edge of the adhesive layer 50 overlaps the third portions 13 of the first electrodes E1a to E1c. The edge of the adhesive layer 50 may be in a location even closer to the edge of the cover member 3, for example, in a location overlapping the second portions 12 of the first electrodes E1a to E1c.

Figure 8:
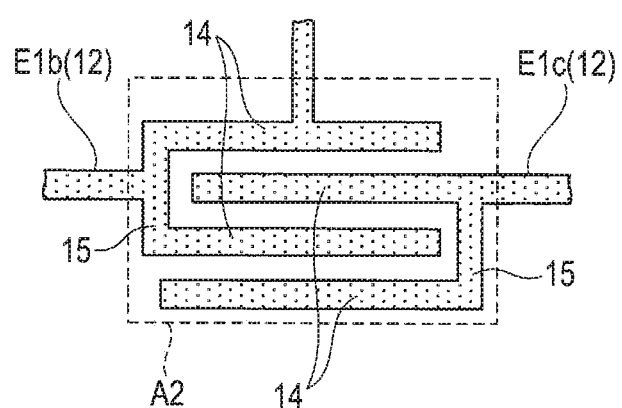
FIG. 8 is an enlarged view of the sensor area shown in FIG. 7.

FIG. 8 is an enlarged view of the sensor area A2 shown in FIG. 7. In the sensor area A2, each of the second portions 12 of the first electrodes E1b and E1c has a base 15 formed along part of the periphery of the sensor area A2, and a plurality of projections 14 extending from the base 15. The base 15 extends in the second direction Y along one side of the sensor area A2, and the projections 14 extend in the first direction X from the base 15. In a plan view, at least one projection 14 of the first electrode E1b is arranged between two projections 14 of the first electrode E1c, and at least one projection 14 of the first electrode E1c is arranged between two projections 14 of the first electrode E1b. According to this structure, the first electrodes E1b and E1c can be dispersed over the whole sensor area A2.

The second portions 12 of the first electrodes E1b and E1c are not necessarily dispersed in the shape of the example shown in FIG. 8 and can also be dispersed in various shapes. The second portions 12 of the first electrodes E1a and E1b in the sensor area A1, and the second portions 12 of the first electrodes E1a and E1c in the sensor area A3 can also be dispersed in the same manner.

In the example shown in FIG. 8, four projections 14 are arranged in the sensor area A2. In this case, four projections 14 may be arranged also in each of the sensor areas A1 and A3, for example. The capacitance in the sensor areas A1 to A3 (the capacitance C2) can be uniformly formed by equalizing the numbers of projections 14 arranged in the sensor areas A1 to A3 in this manner. Note that the numbers of projections 14 arranged in the sensor areas A1 to A3 may be different from each other.

Figure 9:
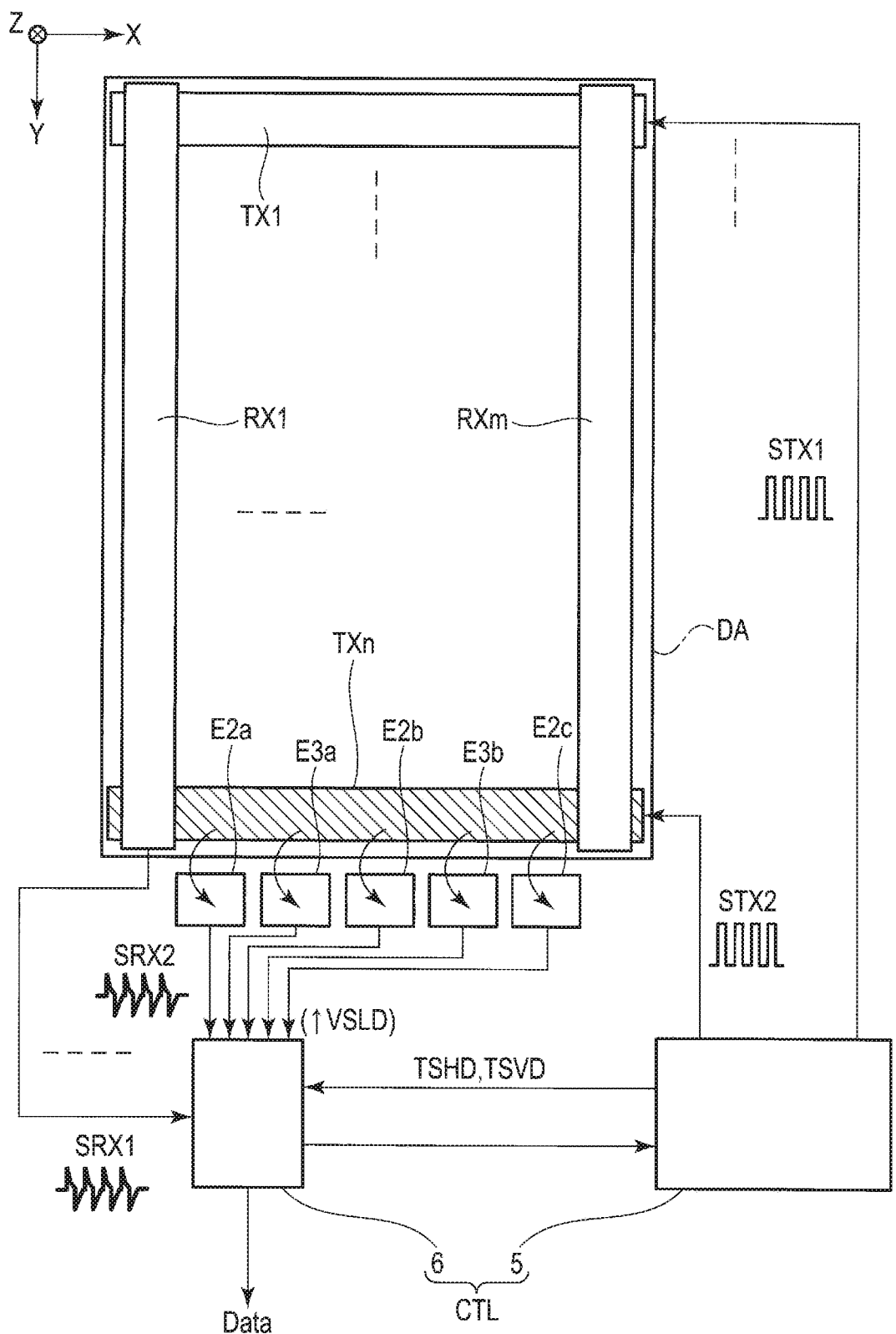
FIG. 9 is a diagram showing a structure related to operation detection in the first embodiment.

Next, an example of the method for detecting operations with respect to the display area DA and the sensor areas A1 to A3 will be described. FIG. 9 is a diagram schematically showing a structure related to operation detection. The operation detection is controlled by a controller CTL. In the present embodiment, the controller CTL includes the driver IC 5 and the detector IC 6. The driver IC 5 and the detector IC 6 cooperate with each other based on mutually-output control signals (TSHD, TSVD, etc.). The controller CTL may include elements other than the driver IC 5 and the detector IC 6. Since the driver IC 5 also supplies an image signal to the signal line S, etc., the controller CTL also controls displaying the image.

In the detection of an operation with respect to the display area DA, the driver IC 5 sequentially supplies a first drive signal STX1 to the drive electrodes TX1 to TXn. The first drive signal STX1 has an alternating-current waveform with a plurality of pulses, for example. A first detection signal SRX1, which has a waveform corresponding to the first drive signal STX1 supplied to the drive electrodes TX1 to TXn, is output from the detection electrodes RX1 to RXm to the detector IC 6. The waveform of the first detection signal SRX1 varies depending on the presence and absence of an operation with respect to the display area DA. In other words, the first detection signal SRX1 varies depending on the object, like finger, in the display area DA. The detector IC 6 detects the presence and absence of an operation with respect to the display area DA based on the first detection signal SRX1 from the detection electrodes RX1 to RXm, and if an operation is performed, the detector IC 6 calculates the coordinates of the operation location. Note that the coordinates of the operation location may be calculated by the driver IC 5 or may also be calculated by an IC (for example, a module such as a CPU) of an electronic device connected via the connector 42, etc.

In the detection of an operation with respect to the sensor area A, the driver IC 5 supplies a second drive signal STX2 to the first drive electrode that is an electrode closest to at least one of the second electrode E2 and the third electrode E3. In FIG. 9, the first drive electrode is the drive electrode TXn. The second drive signal STX2 has the same alternating-current waveform as that of the first drive signal STX1, for example. When the second drive signal STX2 is supplied, an electric field is formed between the drive electrode TXn and each of the electrodes E2a to E2c, E3a and E3b. Therefore, a second detection signal SRX2, which has a waveform corresponding to the second drive signal STX2, is output from the electrodes E2a to E2c, E3a and E3b to the detector IC 6. The waveform of the second detection signal SRX2 varies in accordance with an operation with respect to the vicinity of the sensor areas A1 to A3. In other words, the detection signal SRX2 varies in accordance with the object on the sensor area A. The detector IC 6 detects the presence and absence of operations with respect to the sensor areas A1 to A3 based on the second detection signal SRX2 from the electrodes E2a to E2c, E3a and E3b.

Note that the detector IC 6 can supply a shield voltage VSLD to at least one of the second electrodes E2a to E2c and the third electrodes E3a and E3b. The shield voltage VSLD is a constant voltage (direct current) and can serve as a common voltage supplied to the drive electrode TX in the display operation, or a ground potential, for example. When the shield voltage VSLD is supplied, the electrodes E2a to E2c, E3a and E3b functions as a shield which prevents electric fields from various circuits and wires formed in the terminal area TA from acting on the display area DA. Although the shield voltage VSLD here is supplied from the detector IC 6, this is in no way restrictive. A shield voltage supply wire may be provided in the peripheral area SA of the array substrate AR (first substrate) and a switching element may be provided between at least one of the second electrodes E2a to E2c and the third electrodes E3a and E3b, and a connecting wire to the detector IC 6, and then the state of connection between the shield voltage supply wire and the connecting wire to the detector IC 6 may be switched.

Here, the method for detecting operations with respect to the sensor areas A1 to A3 will be specifically described with reference to an example shown in FIG. 7. The following detection patterns are used in the present embodiment.

[Detection Pattern 1]

Among the electrodes E2a to E2c, E3a and E3b, if the second detection signal SRX2 from the second electrodes E2a and E2b shows a reaction and the second detection signal SRX2 from the others does not show any reaction, an operation of the sensor area A1 is detected.

[Detection Pattern 2]

Among the electrodes E2a to E2c, E3a and E3b, if the second detection signal SRX2 from the second electrodes E2b and E2c shows a reaction and the second detection signal SRX2 from the others does not show any reaction, an operation of the sensor area A2 is detected.

[Detection Pattern 3]

Among the electrodes E2a to E2c, E3a and E3b, if the second detection signal SRX2 from the second electrodes E2a and E2c shows a reaction and the second detection signal SRX2 from the others does not show any reaction, an operation of the sensor area A3 is detected.

In this detection method, when an object such as a user's finger contacts the sensor area A1, the second detection signal SRX2 from the second electrodes E2a and E2b opposed to the first portions 11 of the first electrodes E1a and E1b shows a reaction. Therefore, this falls under the detection pattern 1, and an operation with respect to the sensor area A1 is detected. Further, when an object contacts the sensor area A2, the second detection signal SRX2 from the second electrodes E2b and E2c opposed to the first portions 11 of the first electrodes E1b and E1c shows a reaction. Therefore, this falls under the detection pattern 2, and an operation with respect to the sensor area A2 is detected. Still further, when an object contacts the sensor area A3, the second detection signal SRX2 from the second electrodes E2a and E2c opposed to the first portions 11 of the first electrodes E1a and E1c shows a reaction. Therefore, this falls under the detection pattern 3, and an operation with respect to the sensor area A3 is detected.

Also when an operation is performed in the vicinity of the second electrodes E2a to E2c outside the sensor areas A1 to A3, the second detection signal SRX2 from the second electrodes E2a to E2c may show a reaction. In this case, however, the second detection signal SRX2 from the third electrodes E3a and E3b adjacent to the second electrodes E2a to E2c may also show a reaction, or only the second detection signal SRX2 from the second electrode E2a or the second electrode E2c located at the end may show a reaction. Further, if two or more of the sensor areas A1 to A3 are operated concurrently, the second detection signal SRX2 from all the second electrodes E2a to E2c show a reaction. Since these do not fall under any of the detection patterns 1 to 3, operations of the sensor areas A1 to A3 will not be detected.

According to the above-described detection method, erroneous detection of operations of the sensor areas A1 to A3 can be prevented. Therefore, the operability of the display device 1 improves.

Here, a specific example of the procedure of detecting operations with respect to the display areas DA and the sensor areas A1 to A3 will be described with reference to the timing chart shown in FIG. 10. This timing chart includes a first period T1, a second period T2, a third period T3 and a blanking period BK. The first period T1 is a period of detecting an operation with respect to the display area DA. The second period T2 is a period of detecting operations to the sensor areas A1 to A3 (the second portions 12 of the first electrodes E1a to E1c). The third period T3 is a period of displaying an image in the display area DA.

Figure 10:
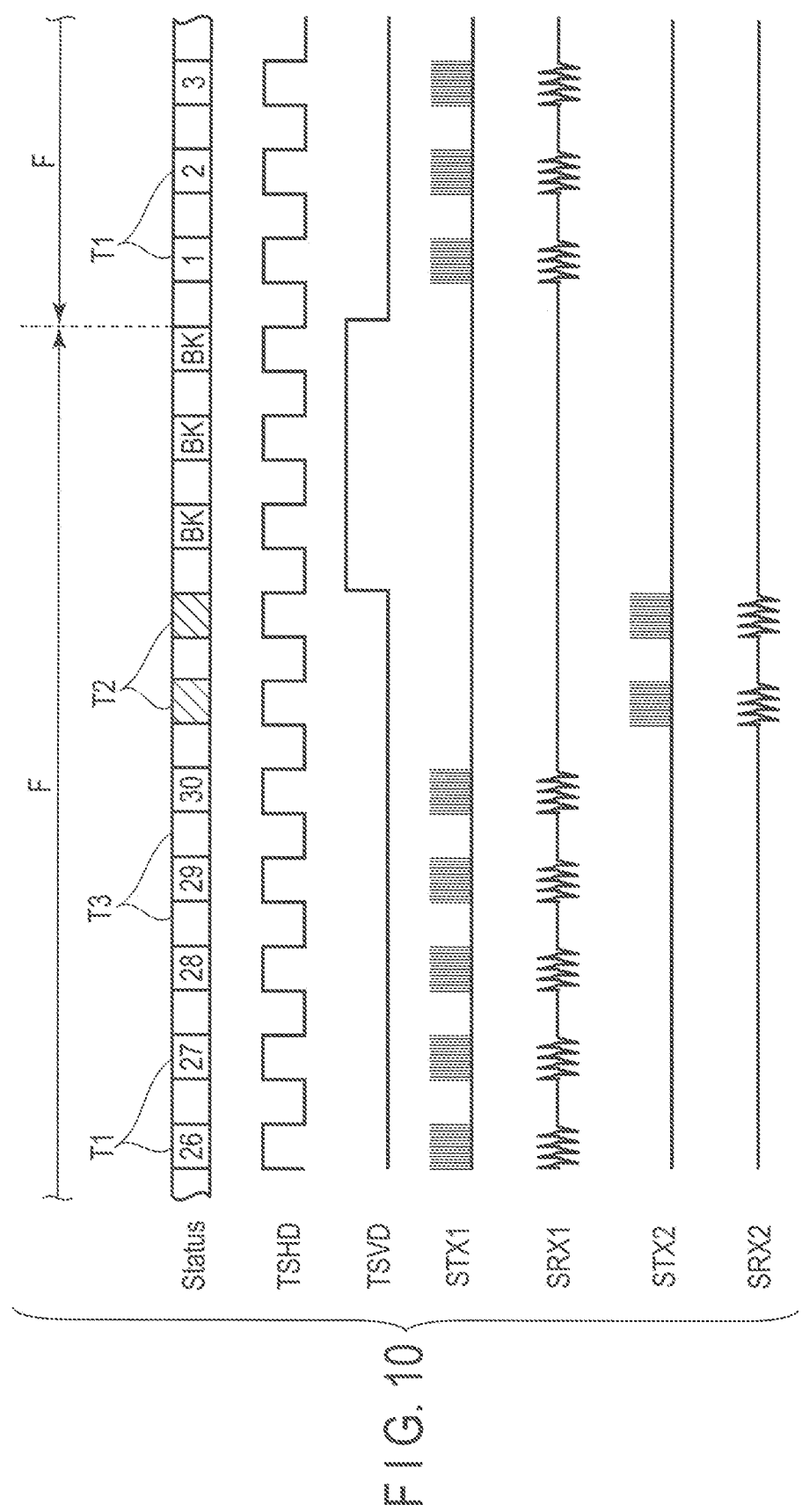
FIG. 10 is a timing chart of the operation detection in the first embodiment.

In the example shown in FIG. 10, the first period T1, the second period T2 and the blanking period BK are set between the third periods T3, each of which comes intermittently in cycles. A frame period F of displaying a single-frame image in the display area DA includes 30 first periods T1 (1 to 30), for example. The control signal TSHD supplied from the driver IC 5 to the detector IC 6 is at a high level in the first period T1, the second period T2 and the blanking period BK, and the control signal TSHD is at a low level in the third period T3. The blanking period BK is set to the end of the frame period F, for example. The control signal TSVD supplied form the driver IC 5 to the detector IC 6 is at a high level in the blanking period BK. In the example shown in FIG. 10, 2 second periods T2 are set after 30 first periods T1 come and before the blanking period BK comes.

In each first period T1, the first drive signal STX1 is sequentially supplied to the drive electrodes TX1 to TXn, and the first detection signal SRX1 according to the first drive signal STX1 is obtained from the detection electrodes RX1 to RXm. The detector IC 6 detects an operation with respect to the display area DA based on the first detection signal SRX1.

In each second period T2, the second drive signal STX2 is supplied to the drive electrode TXn, and the second detection signal SRX2 according to the second drive signal STX2 is obtained from the electrodes E2a to E2c, E3a and E3b. The detector IC 6 detects operations with respect to the sensor areas A1 to A3 based on the second detection signal SRX2.

In the display of an image in the display area DA or the detection of an operation with respect to the display area DA, since various circuits of the peripheral area SA are operated, noises tend to be mixed in the electrodes E2a to E2c, E3a and E3b. In this regard, the second period T2 is separated from the first period T1 and the third period T3, and the influence of noises to the detection of operations of the sensor areas A1 to A3 can be reduced in the example shown in FIG. 10.

Although the present embodiment discloses a case where the single frame period F includes 30 first periods and 2 second periods T2, the numbers of the periods T1 and T2 are not limited to these numbers. Further, the timings of the periods T1 and T2 in the frame period F can also be appropriately changed.

For example, although FIG. 10 shows a case where the first period T1, the second period T2 and the blanking period BK are set between the third periods T3, the periods T1, T2, T3 and BK may be set continuously. For example, the second period T2 may come after all the first periods T1 included in the single frame period F are complete, and the third period T3 may come after all the second periods T2 are complete, and the blanking period BK may come after all the third periods T3 are complete.

For example, the shield voltage VSLD is supplied to the second electrodes E2a to E2c, E3a and E3b in the first period T1, the third period T3 and the blanking period BK. In this way, each of the electrodes E2a to E2c, E3a and E3b acts as a shield.

In the present embodiment described above, the detection sensitivity to an operation with respect to the sensor area A is improved by the structure described with reference to FIGS. 5 and 6. Further, erroneous detection of an operation with respect to the sensor area A can be prevented by the detection method described with reference to FIGS. 7 to 10.

Furthermore, various advantages can be obtained from the present embodiment.

Second Embodiment

In the second embodiment, another example of the shapes of the electrodes E1 to E3 will be described with reference to FIG. 11. The example shown in FIG. 11 differs from the example shown in FIG. 7 in the shapes of the third electrodes E3a and E3b.

The third electrode E3a surrounds the three sides of the second electrode E2a. The third electrode E3b surrounds the three sides of the second electrode E2c. Further, the three sides of the second electrode E2b are surrounded by the third electrode E3a and the third electrode E3b. In other words, the third electrode E3a is formed along the outer edges of the second electrode E2a, and the third electrode E3b is formed along the outer edges of the second electrode E2c. Further, the third electrode E3a and the third electrode E3b are formed along the outer edges of the second electrode E2b.

From another perspective, the third electrodes E3 (E3a, E3b) are arranged between two adjacent ones of the second electrodes E2 (E2a to E2c) and outside the second electrodes E2 (E2a, E2c) located at the ends in the first direction X. In other words, the third electrode E3a is arranged along at least one side of the second electrode E2a and at least one side of the second electrode E2b. The third electrode E3b is arranged along at least one side of the second electrode E2b and at least one side of the second electrode E2c. The third electrode E3a may be arranged along several sides of the second electrode E2b and the third electrode E3b may be arranged along several sides of the second electrode E2b.

Figure 11:
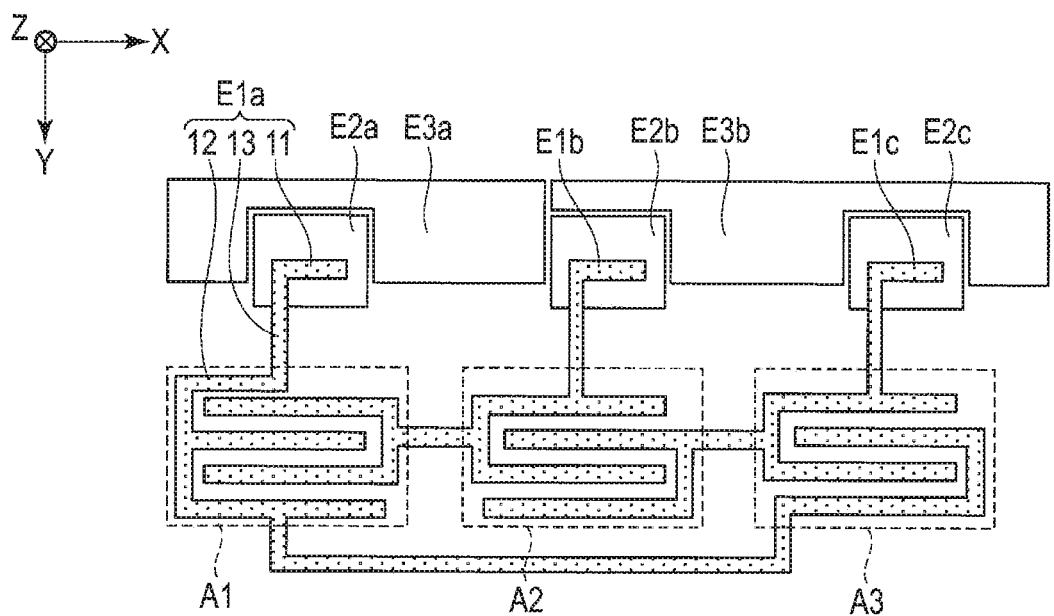
FIG. 11 is a plan view of electrode shapes in the second embodiment.

According to the shapes shown in FIG. 11, the third electrodes E3a and E3b become more responsive when an object contacts the vicinity of the second electrodes E2a to E2c. Therefore, erroneous detection of operations to the sensor areas A1 to A3 can be more effectively prevented.

The third electrodes E3a and E3b shown in FIG. 11 may be realized as an integrated electrode or may be split into more third electrodes E3. Further, the third electrodes E3a and E3b may surround the four sides of the second electrodes E2a to E2c except for portions overlapping the first electrodes E1a to E1c in a plan view.

Third Embodiment

In the third embodiment, another example of the shapes of the electrodes E1 to E3 will be described with reference to FIG. 12. The example shown in FIG. 12 differs from the example shown in FIG. 11 in the shapes of the first electrodes E1a to E1c.

Figure 12:
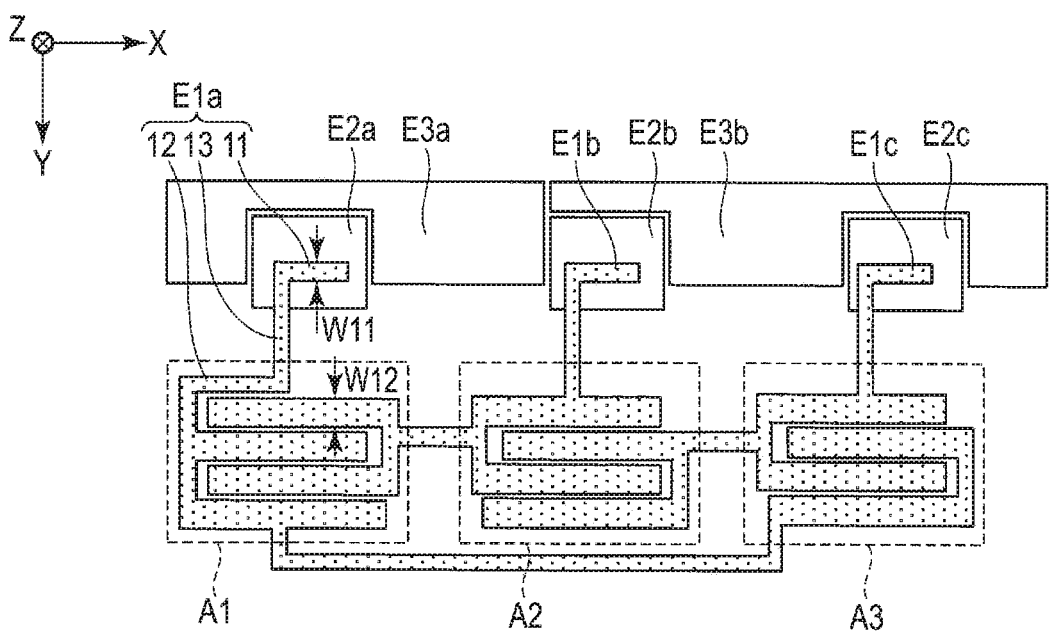
FIG. 12 is a plan view of electrode shapes in the third embodiment.

That is, a width 12 of the second portions 12 of the first electrodes E1a to E1c in the second direction Y is increased in the sensor areas A1 to A3 in the example shown in FIG. 12. Further, the gap between the adjacent second portions 12 is narrowed in the sensor areas A1 to A3. For example, the width W12 is greater than a width W11 of the first portions 11 in the second direction Y.

In this case, the arrangement area of the second portions 12 of the first electrode E1a to E1c is increased in the sensor areas A1 to A3. Therefore, capacitance can be effectively formed between an object contacting the sensor areas A1 to A3 and the first electrodes E1a to E1c, and the sensitivity to an operation improves, accordingly.

Fourth Embodiment

In the fourth embodiment, another example of the shapes of the electrodes E1 to E3 will be described with reference to FIG. 13. The example shown in FIG. 13 differs from the example shown in FIG. 11 in the shapes of the first electrodes E1a to E1c.

That is, the second portion 12 of the first electrode E1a is arranged on the left half of the sensor area A1, and the second portion 12 of the first electrode E1c is arranged on the right half of the sensor area A3 in the example shown in FIG. 13. Further, the second portion 12 of the first electrode E1b is arranged on the right half of the sensor area A1, the left half of the sensor area A3, and substantially the whole sensor area A2.

Each of the second portions 12 of the first electrodes E1a and E1b has the projections 14 and the base 15 in the sensor area A1. Similarly, each of the second portions 12 of the first electrodes E1b and E1c has the projections 14 and the base 15 in the sensor area A3. Similarly to the example shown in FIG. 8, one projection 14 of one first electrode E1 is arranged between two projections 14 of the other first electrode E1.

The following detection patterns are used in the present embodiment.

[Detection Pattern 1]

Among the electrodes E2a to E2c, E3a and E3b, if the second detection signal SRX2 from the second electrodes E2a and E2b shows a reaction and the second detection signal SRX2 from the others does not show any reaction, an operation of the sensor area A1 is detected.

[Detection Pattern 2]

Among the electrodes E2a to E2c, E3a and E3b, if only the second detection signal SRX2 from the second electrode E2b shows a reaction and the second detection signal SRX2 from the others does not show any reaction, an operation of the sensor area A2 is detected.

[Detection Pattern 3]

Among the electrodes E2a to E2c, E3a and E3b, if the second detection signal SRX2 from the second electrodes E2b and E2c shows a reaction and the second detection signal SRX2 from the others does not show any reaction, an operation of the sensor area A3 is detected.

In this detection method also, operations with respect to the sensor areas A1 to A3 can be accurately detected and erroneous detection of the operations can be prevented, similarly to the above-described embodiments.

Fifth Embodiment

In the fifth embodiment, another example of the shapes of the electrodes E1 to E3 will be described with reference to FIG. 14. The example shown in FIG. 14 differs from the above-described examples in that first electrodes E1d and E1e and second electrodes E2d and E2e are further provided but the third electrodes E3 are not provided.

The second electrodes E2d and E2e have the same shapes as those of the third electrodes E3a and E3b shown in FIGS. 11 to 13, for example. Note that first portions 11 of the first electrodes E1d and E1e are opposed to the second electrodes E2d and E2e, respectively.

In the example shown in FIG. 14, second portions 12 of the first electrodes E1d and E1e are arranged in the sensor area A1, the second portions 12 of the first electrodes E1a and E1b are arranged in the sensor area A2, and the second portions 12 of the first electrodes E1c and E1d are arranged in the sensor area A3.

The following detection patterns are used in the present embodiment.

[Detection Pattern 1]

Among the second electrodes E2a to E2e, if the second detection signal SRX2 from the second electrodes E2d and E2e shows a reaction and the second detection signal SRX2 from the other does not show any reaction, an operation of the sensor area A1 is detected.

[Detection Pattern 2]

Among the second electrodes E2a to E2e, if the second detection signal SRX2 from the second electrodes E2a and E2b shows a reaction and the second detection signal SRX2 from the other does not show any reaction, an operation of the sensor area A2 is detected.

[Detection Pattern 3]

Among the second electrodes E2a to E2e, if the second detection signal SRX2 from the second electrodes E2c and E2d shows a reaction and the second detection signal SRX2 from the other does not show any reaction, an operation of the sensor area A3 is detected.

In this detection method also, operations with respect to the sensor areas A1 to A3 can be accurately detected and erroneous detection of the operations can be prevented, similarly to the above-described embodiments.

Sixth Embodiment

The first embodiment discloses a case where the second drive signal STX2 is supplied to the drive electrode TXn, and operations with respect to the sensor areas A1 to A3 are detected based on the second detection signal SRX2 obtained from each second electrode E2 and each third electrode E3.

However, operations with respect to the sensor areas A1 to A3 can also be detected based on a change in self-capacitance (stray capacitance) that exists in each second electrode E2 and each third electrode 3. This detection method is referred to as a self-capacitive detection method. For example, the detector IC 6 detects operations with respect to the sensor areas A1 to A3 based on a change in potential of each of the electrodes E2a to E2c, E3a and E3b (corresponding to the second detection signal SRX2) in the second period T2 shown in FIG. 10.

Note that an operation with respect to the display area DA can also be detected by the self-capacitive detection method. In this case, the self-capacitance of the detection electrode RX or the drive electrode TX may be used. Alternatively, both the self-capacitive detection method and the method of the first embodiment (mutual-capacitive detection method) may also be used for detecting operations with respect to the sensor areas A1 to A3 and an operation with respect to the display area DA.

For example, in the display area DA, the sensor electrodes are arranged in a matrix instead of the detection electrode RX and the drive electrode TX. The sensor electrode has a rectangle shape and is arranged on at least one of the array substrate AR and the counter substrate CT. The controller supplies the first drive signal to the sensor electrode and detects the change of the self-capacitance of the sensor electrode. Further, in the sensor area A, the controller supplies the second drive signal to the sensor electrodes closest to the second electrode E2 or the third electrodes E3 as the first drive electrode.

Seventh Embodiment

In the seventh embodiment, another example of the method for detecting an operation with respect to the sensor area A will be described with reference to FIG. 15.

Figure 15:
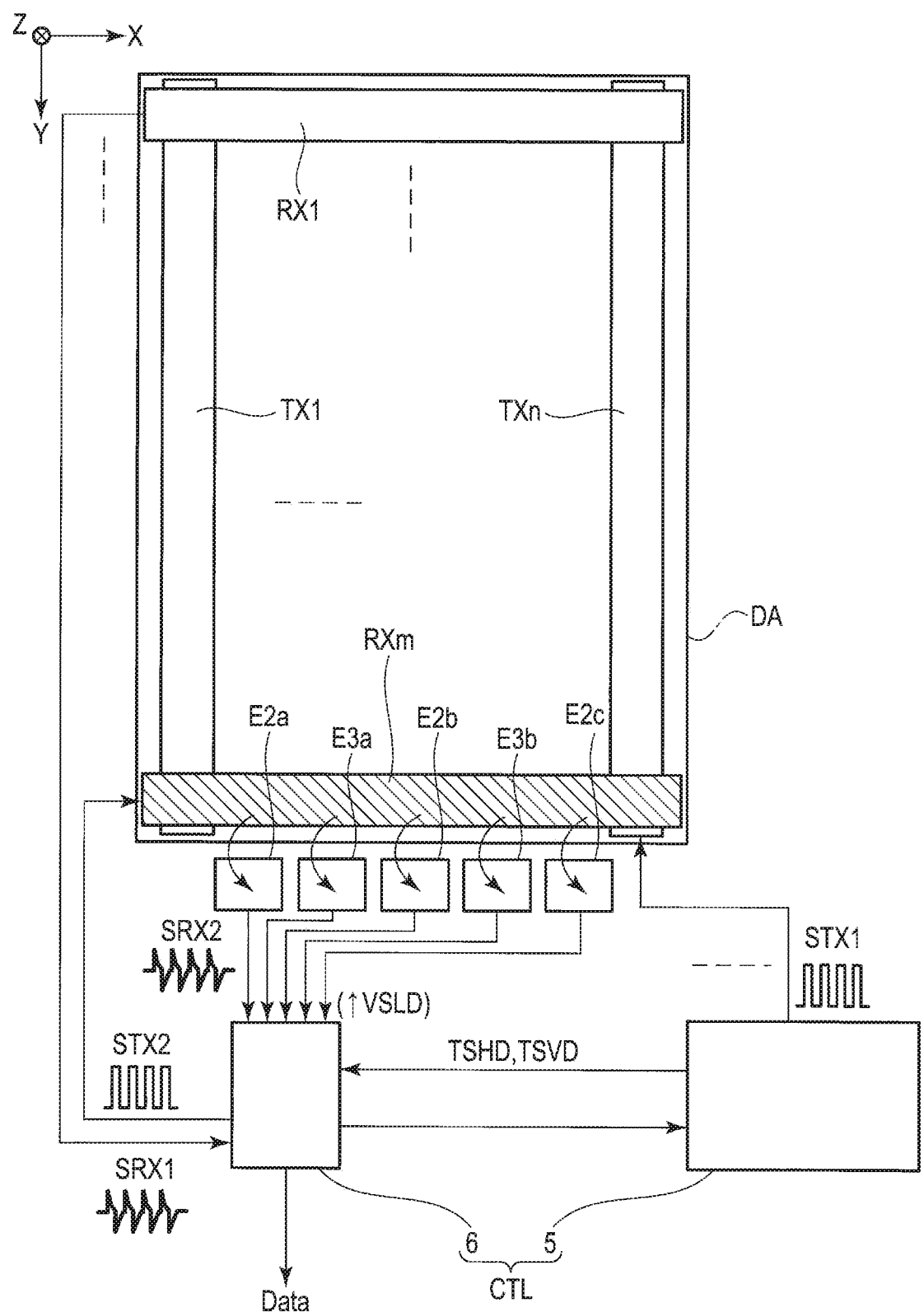
FIG. 15 is a diagram showing a detection method in the seventh embodiment.

The drive electrodes TX1 to TXn extend in the second direction Y and are arranged in the first direction X in the example shown in FIG. 15. Further, the detection electrodes RX1 to RXm extend in the first direction X and are arranged in the second direction Y.

In the present embodiment, the detector IC 6 supplies the second drive signal STX2 to the first drive electrode closest to the second electrode E2 and the third electrodes E3. In FIG. 15, the first drive electrode is the detection electrode RXm. In this case also, the second detection signal SRX2 can be obtained from each of the electrodes E2a to E2c, E3a and E3b.

Eighth Embodiment

In the eighth embodiment, another example of the method for detecting an operation with respect to the sensor area A will be described with reference to FIG. 16. The drive electrodes TX1 to TXn and the detection electrodes RX1 to RXm are arranged in the same manner as that of the example shown in FIG. 15.

Figure 16:
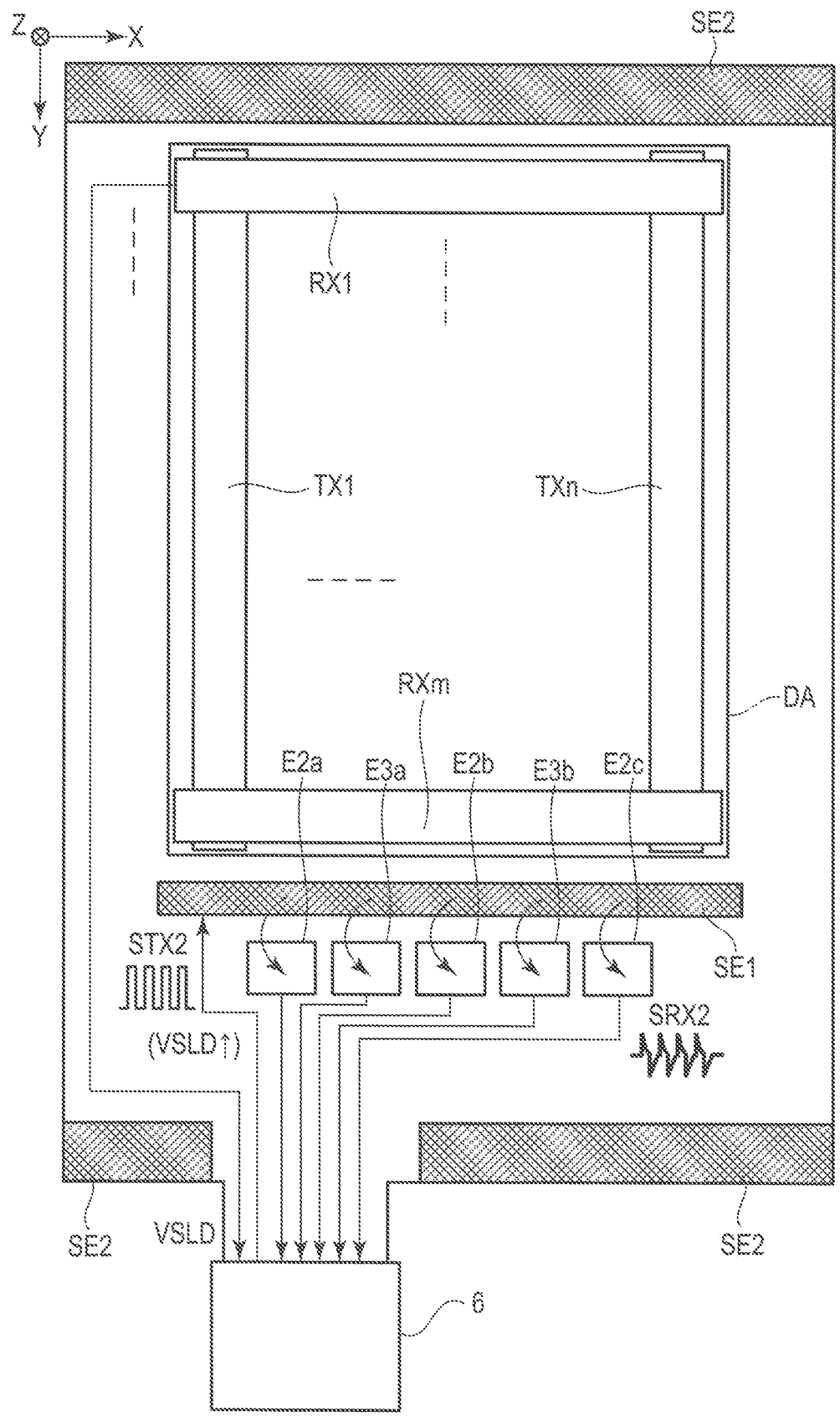
FIG. 16 is a diagram showing a detection method in the eighth embodiment.

A first shield electrode SE1 (fourth electrode) is provided between the display area DA and at least one of the second electrode E2 and the third electrode E3 in the example shown in FIG. 16. Further, second shield electrodes SE2 (fifth electrodes) are provided in appropriate locations. For example, the second shield electrodes SE2 can be provided outside various circuits and wires arranged in and around the display area DA. In other words, the second shield electrode SE2 is arranged along at least a part of the outer edge of the display panel 2.

For example, the shield electrodes SE1 and SE2 are formed in the counter-substrate CT similarly to the electrodes E2a to E2c, E3a and E3b. The shield electrodes SE1 and SE2 are formed of thin metal wire mesh.

The detector IC 6 supplies the shield voltage VSLD to the first shield electrode SE1 in the first period T1, the third period T3 and the blanking period BK shown in FIG. 10. Here, the shield voltage VSLD may also be supplied to the electrodes E2a to E2c, E3a and E3b. When the shield voltage VSLD is supplied, the first shield electrode SE1 and the electrodes E2a to E2c, E3a and E3b act as shields which prevent electric fields from various circuits and wires formed in the terminal area TA from acting on the display area DA.

Further, the detector IC 6 supplies the shield voltage VSLD to the second shield electrode SE2 in all the periods. The second shield electrode SE2 acts as a shield which protects the various circuits and wires of the display device 1 from electrostatic breakdown.

In the present embodiment, the detector IC 6 supplies the second drive signal STX2 to the first shield electrode SE1 in the second period T2 of detecting operations with respect to the sensor areas A1 to A3. When the second drive signal STX2 is supplied, an electric field is formed between the first shield electrode SE1 and each of the electrodes E2a to E2c, E3a and E3b. Therefore, the second detection signal SRX2 which have a waveform corresponding to the second drive signal STX2 is output from the electrodes E2a to E2c, E3a and E3b.

The structures according to the first to eighth embodiments can be appropriately combined with each other.

Further, the location for providing the sensor area A can be appropriately changed in each embodiment. For example, the sensor area A may be arranged in an area opposite to the terminal area TA in the peripheral area SA.

Still further, although the display device 1 also functions as the detection device 100 in each embodiment, the detection device 100 may be provided as a device independent from the display device 1. In this case, the detection device 100 may be used together with the display device 1 or may be used for another purpose unrelated to the display device 1. In the detection device 100, the detection area is arranged instead of the display area DA. The detection area is an area in which the drive electrode TX and the detection electrode RX are arranged.

Still further, each embodiment discloses a case where detection of an operation with respect to the display area DA and detection of an operation with respect to the sensor area A are performed by the detector IC 6. However, the detection may be executed by different modules. In this case, modules are included in the controller CTL.

Still further, each embodiment discloses a case where the driver IC 5 is provided on the terminal area TA. However, the mounting location of the driver IC 5 is not limited to this example and may be provided on the first flexible printed circuit board 7 (fourth substrate), for example. In this case, the drive electrode TX is connected to the driver IC 5 via a lead line formed around the display area DA and the first flexible printed circuit board 7.

Still further, the driver IC 5 and the detector IC 6 disclosed in each embodiment may be a single module. For example, the driver IC 5 may execute the processing of the detector IC 6 described in each embodiment. In this case, for example, the second flexible printed circuit board 8 (fifth substrate) may be connected to the terminal area TA of the array substrate AR, and each detection electrode RX may be connected to the driver IC 5 via the second flexible printed circuit board 8 and the wire of the array substrate AR.

In this structure, the driver IC 5 detects the presence and absence of an operation with respect to the display area DA based on the first detection signal SRX1 from the detection electrodes RX1 to RXm. Further, the driver IC 5 detects the presence and absence of operations with respect to the sensor areas A1 to A3 based on the second detection signal SRX2 from the electrodes E2a to E2c, E3a and E3b.

Still further, each embodiment discloses a case where the drive electrodes TX is formed in the array substrate AR (first substrate) and the detection electrode RX is formed in the counter-substrate (second substrate). However, the first substrate in which the drive electrode TX is formed is not limited to the array substrate AR. Similarly, the second substrate in which the detection electrode RX is formed is not limited to the counter-substrate CT.

Still further, the drive electrode TX and the detection electrode RX may be formed in the same substrate. As one example, the display device 1 and the detection device 100 may include the first substrate and the second substrate opposed to the first substrate, and the drive electrode TX and the detection electrode RX may be formed in the second substrate. The first substrate and the second substrate here may be the array substrate AR and the counter-substrate CT, for example. As another example, the first substrate may be the counter-substrate CT, and the second substrate may be another substrate opposed to the counter-substrate CT on the opposite side to the array substrate AR.

Still further, each embodiment discloses a case where one or two second portions 12 of the first electrode E1 are arranged in one sensor area A. However, three or more second portions 12 of the first electrode E1 may be arranged in one sensor area A.

All display devices and detection devices which are implementable by a person of ordinary skill in the art with proper changes in design based on the display devices and detection devices described as the embodiments of the present invention come within the scope of the present invention as long as they are in keeping with the spirit of the present invention.

In the scope of the technical concept of the present invention, various modifications are conceivable by a person of ordinary skill in the art, but such modifications also come within the scope of the present invention as a matter of course. For example, the above-described embodiments with appropriate addition, deletion and/or design change of structural elements, or appropriate addition, omission and/or condition change of manufacturing processes by a person of ordinary skill in the art also come within the scope of the present invention as long as they fall within the scope and spirit of the present invention.

Still further, with regard to advantages other than those described in each embodiment, advantages obvious from the description of the specification and advantages appropriately conceivable by a person of ordinary skill in the art are also considered as advantages achievable from the present invention as a matter of course.

What is claimed is:

1. A display device comprising:
   a display panel having a plurality of pixels in a display area;
   a first substrate opposed to the display panel;
   an adhesive layer arranged between the display panel and the first substrate;
   a first electrode arranged on the first substrate in a peripheral area, the peripheral area being arranged along at least a part of an outer edge of the display area;
   a second electrode arranged on the display panel in the peripheral area, wherein
   the first electrode includes:
      a first portion which is opposed to the second electrode; and
      a second portion which is not opposed to the second electrode, and
   the adhesive layer is interposed between the first portion and the second electrode, and is directly in contact with the first portion and the second electrode; and
   a third electrode arranged on the display panel in the peripheral area,
   wherein the third electrode is not opposed to the first electrode and is adjacent to the second electrode in a plan view.

2. The display device of claim 1, further comprising:
   a controller;
   a plurality of drive electrodes arranged in the display area; and
   a plurality of detection electrodes arranged in the display area and opposed to the drive electrodes, respectively, wherein
   the controller is configured to supply a first drive signal to the drive electrodes, and to detect an operation with respect to the display area based on a first detection signal obtained from each of the detection electrodes in accordance with the first drive signal, and
   the controller is configured to supply a second drive signal to either the drive electrode or the detection electrode closest to the second electrode and the third electrode, and to detect an operation with respect to the peripheral area based on a second detection signal output from the second electrode and the third electrode in accordance with the second drive signal.

3. A display device comprising:
   a display panel having a plurality of pixels in a display area;
   a first substrate opposed to the display panel;
   a plurality of first electrodes arranged on the first substrate in a peripheral area, the peripheral area being arranged along at least a part of an outer edge of the display area;
   a plurality of second electrodes arranged on the display panel in the peripheral area; and
   a third electrode arranged on the display panel in the peripheral area, wherein
   each of the first electrodes include:
      a first portion which is opposed to the second electrode; and
      a second portion which is not opposed to the second electrode, and
   the third electrode is not opposed to the first electrodes and is adjacent to the second electrodes in a plan view.

4. The display device of claim 3, wherein the third electrode is arranged between two of the first electrodes adjacent to each other in a plan view.

5. The display device of claim 3, wherein the third electrode is arranged between two of the second electrodes adjacent to each other.

6. The display device of claim 3, wherein
   the second portion of one of the first electrodes is arranged in a sensor area, and
   the sensor area is arranged in the peripheral area.

7. The display device of claim 6, wherein
   the second electrodes and the third electrode are arranged in a first direction, and
   a first width of the sensor area in the first direction is greater than a second width of one of the second electrodes in the first direction.

8. The display device of claim 6, further comprising:
   a controller;
   a plurality of drive electrodes arranged in the display area; and
   a plurality of detection electrodes arranged-in the display area and opposed to the drive electrodes, respectively, wherein
   the controller is configured to supply a first drive signal to the drive electrodes, and to detect an operation with respect to the display area based on a first detection signal obtained from the detection electrodes in accordance with the first drive signal, and
   the controller is configured to supply a second drive signal to either the drive electrode or the detection electrode closest to the second electrodes and the third electrode, and to detect an operation with respect to the sensor area based on a second detection signal output from the second electrodes and the third electrode in accordance with the second drive signal.

9. The display device of claim 8, wherein
   the controller is configured to detect an operation with respect to the sensor area based on the second detection signal from the second electrodes when the second detection signal from the third electrode does not show any reaction, and
   the controller is configured not to detect an operation with respect to the sensor area when the second detection signal output from the third electrode shows a reaction.

10. The display device of claim 6, further comprising:
a fourth electrode arranged between the display area, and the second electrodes and the third electrode, in the peripheral area; and
a controller configured to supply a second drive signal to the fourth electrode and to detect an operation with respect to the sensor area based on a second detection signal output from the second electrodes or the third electrode in accordance with the second drive signal.

11. The display device of claim 10, wherein the controller is configured to supply a certain voltage to the second electrodes, the third electrode or the fourth electrode in a period in which the controller does not supply the second drive signal to the fourth electrode.

12. The display device of claim 6, further comprising a controller configured to detect an operation with respect to the sensor area based on a second detection signal output from the second electrodes and the third electrode in accordance with a change in self-capacitance.

13. The display device of claim 3, wherein
the second portion of one of the first electrodes is arranged in two or more of sensor areas, and
the two or more of sensor areas arranged in the peripheral area.

14. The display device of claim 3, wherein
the second portion has a base and a plurality of projections projecting from the base and including a first projection and a second projection, and
the first projection of one of the first electrodes is arranged between the first projection and the second projection of another one of the first electrodes.

15. The display device of claim 3, further comprising a controller, wherein
the second electrodes and the third electrode are connected to the controller,
the controller is configured to receive a detection signal from the second electrodes or the third electrode, and
the controller is configured to supply a certain voltage to the second electrodes or the third electrode in a period in which the controller does not receive the detection signal.

* * * * *